(12) United States Patent
Li et al.

(10) Patent No.: US 11,152,330 B2
(45) Date of Patent: Oct. 19, 2021

(54) SEMICONDUCTOR PACKAGE STRUCTURE AND METHOD FOR FORMING THE SAME

(71) Applicant: Taiwan Semiconductor Manufacturing Co., Ltd., Hsinchu (TW)

(72) Inventors: Cheng-Chieh Li, Hsinchu (TW); Pu Wang, Hsinchu (TW); Chih-Wei Wu, Zhuangwei Township, Yilan County (TW); Ying-Ching Shih, Hsinchu (TW); Szu-Wei Lu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/385,242

(22) Filed: Apr. 16, 2019

(65) Prior Publication Data

US 2020/0335479 A1 Oct. 22, 2020

(51) Int. Cl.
| | |
|---|---|
| *H01L 21/48* | (2006.01) |
| *H01L 21/56* | (2006.01) |
| *H01L 21/683* | (2006.01) |
| *H01L 21/78* | (2006.01) |
| *H01L 25/065* | (2006.01) |
| *H01L 23/367* | (2006.01) |
| *H01L 25/00* | (2006.01) |

(52) U.S. Cl.
CPC ...... *H01L 25/0652* (2013.01); *H01L 21/4882* (2013.01); *H01L 21/565* (2013.01); *H01L 21/6835* (2013.01); *H01L 21/78* (2013.01); *H01L 23/3675* (2013.01); *H01L 25/50* (2013.01); *H01L 2221/68327* (2013.01); *H01L 2225/06513* (2013.01); *H01L 2225/06517* (2013.01); *H01L 2225/06541* (2013.01); *H01L 2225/06555* (2013.01); *H01L 2225/06586* (2013.01); *H01L 2225/06589* (2013.01)

(58) Field of Classification Search
CPC ............................ H01L 25/0652; H01L 21/56
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |

(Continued)

*Primary Examiner* — Moazzam Hossain
(74) *Attorney, Agent, or Firm* — McClure, Qualey & Rodack, LLP

(57) ABSTRACT

A method for forming a semiconductor package structure includes stacking chips to form a chip stack over an interposer. The method also includes disposing a semiconductor die over the interposer. The method also includes filling a first encapsulating layer between the chips and surrounding the chip stack and the semiconductor die. The method also includes forming a second encapsulating layer covering the chip stack and the semiconductor die. The first encapsulating layer fills the gap between the chip stack and the semiconductor die.

20 Claims, 12 Drawing Sheets

(56) References Cited

U.S. PATENT DOCUMENTS

| | | | |
|---|---|---|---|
| 9,735,131 B2 | 8/2017 | Su et al. | |
| 9,905,529 B2* | 2/2018 | Sakata | H01L 24/81 |
| 2015/0279828 A1* | 10/2015 | Koopmans | H01L 25/0652 |
| | | | 257/713 |
| 2015/0371938 A1* | 12/2015 | Katkar | H01L 25/0655 |
| | | | 257/774 |
| 2016/0163650 A1* | 6/2016 | Gao | H01L 21/486 |
| | | | 257/773 |
| 2016/0260680 A1* | 9/2016 | Sakata | H01L 24/75 |
| 2017/0283247 A1* | 10/2017 | Meyer | B81C 1/00238 |
| 2018/0188448 A1* | 7/2018 | Yim | H01L 25/0652 |
| 2018/0294249 A1* | 10/2018 | Watanabe | H01L 25/50 |
| 2018/0366457 A1* | 12/2018 | Goh | H01L 23/36 |
| 2019/0148305 A1* | 5/2019 | Lin | H01L 24/19 |
| | | | 257/774 |
| 2020/0185298 A1* | 6/2020 | Kang | H01L 23/3121 |

* cited by examiner

SEMICONDUCTOR PACKAGE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
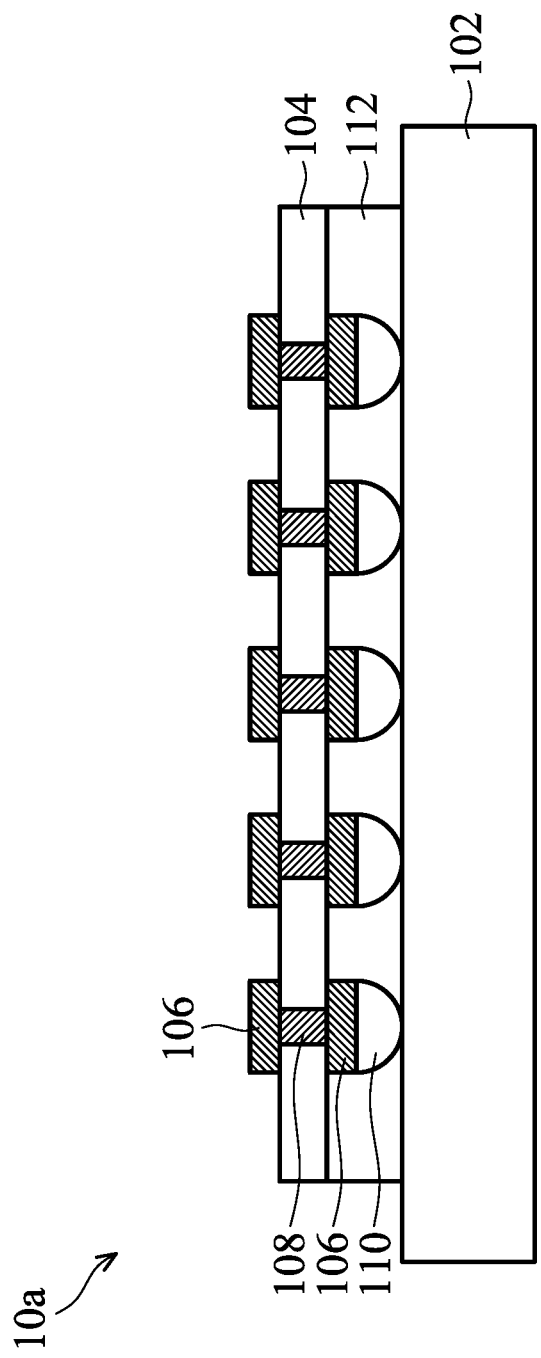
FIGS. 1A-1G are cross-sectional representations of various stages of forming a semiconductor package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor package structure are provided. The method for forming the semiconductor package structure may include stacking chips on an interposer directly. Many processes may be skipped and the production cost may be reduced. Tool utilities may be also improved. In addition, the structure flexibility of die placement, die size, and die gap may be improved.

FIGS. 1A-1G are cross-sectional representations of various stages of forming a semiconductor package structure 10a, in accordance with some embodiments of the disclosure. A carrier substrate 102 is provided as shown in FIG. 1A in accordance with some embodiments. The carrier substrate 102 may provide temporary mechanical and structural support during subsequent processing steps. The carrier substrate 102 may include glass, silicon, silicon oxide, aluminum oxide, metal, the like, or a combination thereof. The carrier substrate 102 may include a metal frame.

Next, a chip wafer 104 is disposed over the carrier substrate 102 as shown in FIG. 1A in accordance with some embodiments. In some embodiments, the chip wafer 104 is a memory chip wafer (e.g., a high bandwidth memory (HBM) or a hybrid memory cube (HMC)) or a passive component chip wafer.

Through substrate vias (TSVs) 108 are formed in the chip wafer 104 between the conductive pillars 106 as shown in FIG. 1A in accordance with some embodiments. The TSVs 108 may include copper, polysilicon, tungsten, other conductive material, or a combination thereof. The TSVs 108 may be formed by firstly forming openings in the chip wafer 104 by an etching process (e.g., a reactive ion etching (RIE) process), and the openings are filled with conductive material by deposition process such as a sub-atmospheric chemical vapor deposition (SACVD) process, a physical vapor deposition (PVD) process, an atomic layer deposition (ALD) process, or a combination thereof.

Conductive pillars 106 are formed over opposite sides of the chip wafer 104, as shown in FIG. 1A in accordance with some embodiments. The TSVs 108 may form electrical connections between the conductive pillars 106 on the opposite sides of the chip wafer 104. In some embodiments, the conductive pillars 106 are stacked conductive structures. The conductive pillars 106 may include copper, nickel, other conductive material, or a combination thereof. In some embodiments, the conductive pillars 106 may include nickel sandwiched with copper. In some embodiments, the conductive pillars 106 may include stacked nickel and copper. The conductive pillars 106 may formed by a sputtering process, an electroplating process, an electroless plating process, a chemical vapor deposition (CVD) process, the like, or a combination thereof.

A solder element 110 is formed on the conductive pillars 106 as shown in FIG. 1A in accordance with some embodiments. The solder element 110 may be made of Sn, Ag, Au, other suitable conductive materials, or a combination thereof. In some embodiments, the solder element 110 is formed on the conductive pillars 106 only on one side of the chip wafer 104.

After the conductive pillars 106 and the solder element 110 are formed, the chip wafer 104 is placed on an adhesive tape 112 as shown in FIG. 1A in accordance with some embodiments. In some embodiments, the conductive pillars 106 with the solder element 110 formed thereon are placed on the adhesive tape 112.

Figure 1B:
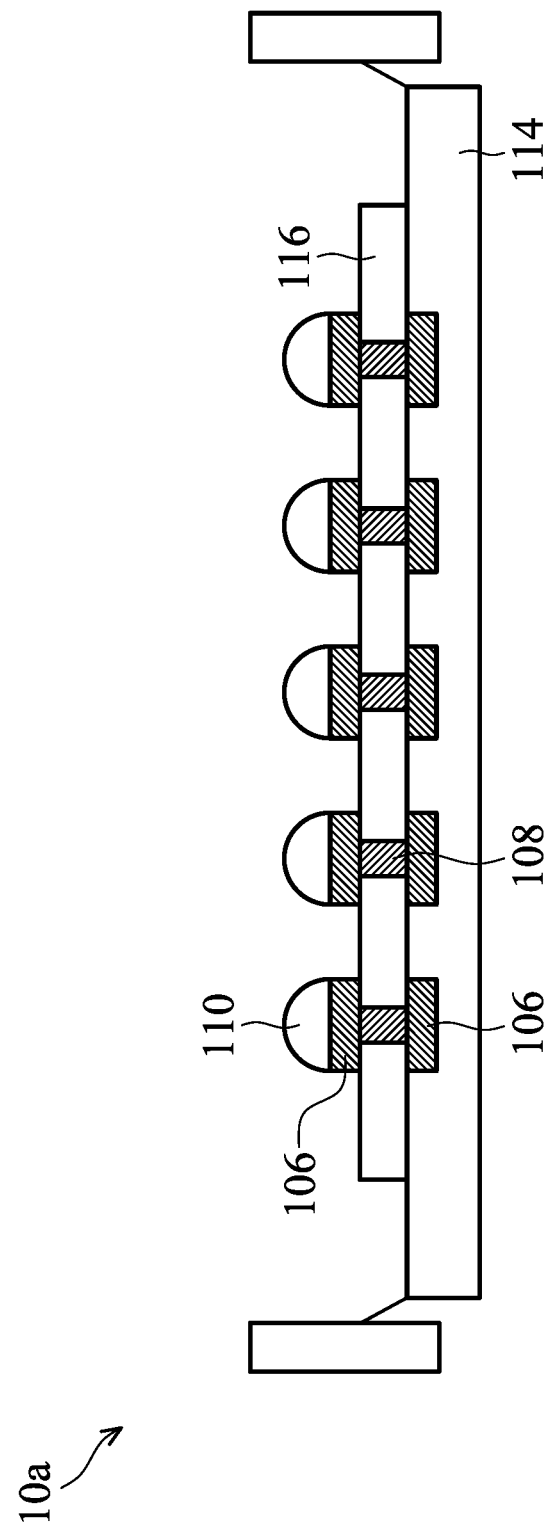

Next, the chip wafer 104 is flipped over and placed on a tape 114 as shown in FIG. 1B in accordance with some embodiments. In some embodiments, the conductive pillars 106 without the solder element 110 formed thereon are placed on the tape 114. The chip wafer 104 is then debonded from the carrier substrate 102 and the adhesive tape 112 is removed from the chip wafer 104. Afterwards, the chip wafer 104 is cut to form a chip 116. In some embodiments, the chip wafer 104 is cut while the chip wafer 104 is on the tape 114. The chip wafer 104 may be cut by a sawing process, a laser process, or a combination thereof.

Figure 1C:
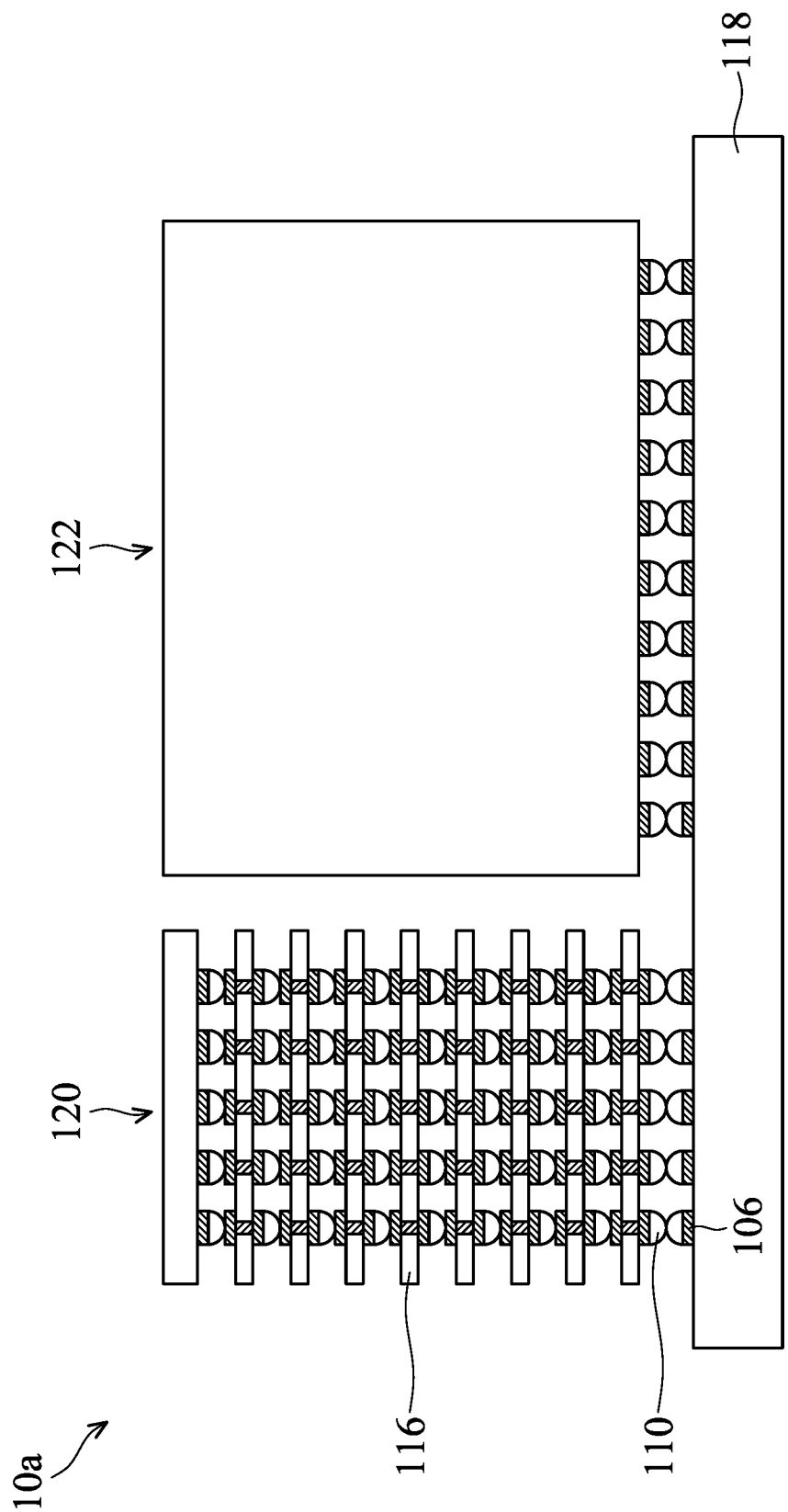

Next, an interposer 118 is provided as shown in FIG. 1C in accordance with some embodiments. The interposer 118 may be a supporting material that carries the conductive pads to receive conductive terminals. The interposer 118 may be made of bismaleimide triazine (BT) resin, FR-4 (a composite material composed of woven fiberglass cloth with an epoxy resin binder that is flame resistant), ceramic, glass, plastic, tape, film, or a combination thereof.

Next, conductive pillars 106 are formed over the interposer 118 as shown in FIG. 1C in accordance with some embodiments. Afterwards, the chip 116 is placed over the conductive pillars 106 over the interposer 118. In some embodiments, the chip 116 is placed over the interposer 118 by a pick-and-place machine process.

Next, more chips 116 are stacked over the interposer 118 to form a chip stack 120 as shown in FIG. 1C in accordance with some embodiments. In some embodiments, the chips 116 are stacked by aligning the conductive pillars 106 over the adjacent chips 116 in the chip stack 120.

Next, a semiconductor die 122 is placed over the conductive pillars 106 over the interposer 118 as shown in FIG. 1C in accordance with some embodiments. In some embodiments, the semiconductor die 122 is a system-on-chip (SoC) die, such as a logic die. The logic die may be a central processing unit (CPU), a graphics processing unit (GPU), a memory controller, or the like. In some embodiments, the semiconductor die 122 is placed over the interposer 118 by a pick-and-place machine process. In some embodiments, the chip stack 120 and the semiconductor die 122 are disposed over the interposer 118 in a single tool. Therefore, the tool utilities may be improved.

It should be noted that the number of chips 116 in the chip stack 120 is merely an example, and the present disclosure is not limited thereto, depending on the demands of the application. In some embodiments, the total height of the chip stack 120 is substantially the same as the height of the semiconductor die 122. That is, the top surface of the chip stack 120 is level with the top surface of the semiconductor die 122. Therefore, it may be easier for subsequently grinding process on the chip stack 120 and the semiconductor die 122.

Afterwards, the solder element 110 over the adjacent chips 116 in the chip stack 120 and the solder element 110 over the interposer 118 are reflowed in accordance with some embodiments (not shown). As a result, the bonding strength of the solder element 110 is enhanced. Therefore, the adjacent chips 116 in the chip stack 120 are bonded to each other, and the chip stack 120 and the semiconductor die 122 are mounted onto the interposer 118. In some embodiments, a cleaning process is performed to remove the flux used in the reflowing process. The cleaning process may help to prevent corrosion and electromigration.

Next, the chip stack 120 and the semiconductor die 122 are heated in accordance with some embodiments (not shown). The chip stack 120 and the semiconductor die 122 may be heated to dehydrate the chip stack 120 and the semiconductor die 122. The chip stack 120 and the semiconductor die 122 may be heated by a pre-baking process. The heating process may be performed at a temperature that is in a range from about 100° C. to about 250° C. for about 0.5 hour to about 24 hours.

Next, a plasma treatment is applied to the chip stack 120 and the semiconductor die 122 in accordance with some embodiments (not shown). The plasma treatment may help to remove oxides over the surfaces of the chip stack 120 and the semiconductor die 122. Therefore, the subsequently formed encapsulating layer may be formed over the surfaces of the chip stack 120 and the semiconductor die 122 more easily.

Figure 1D:
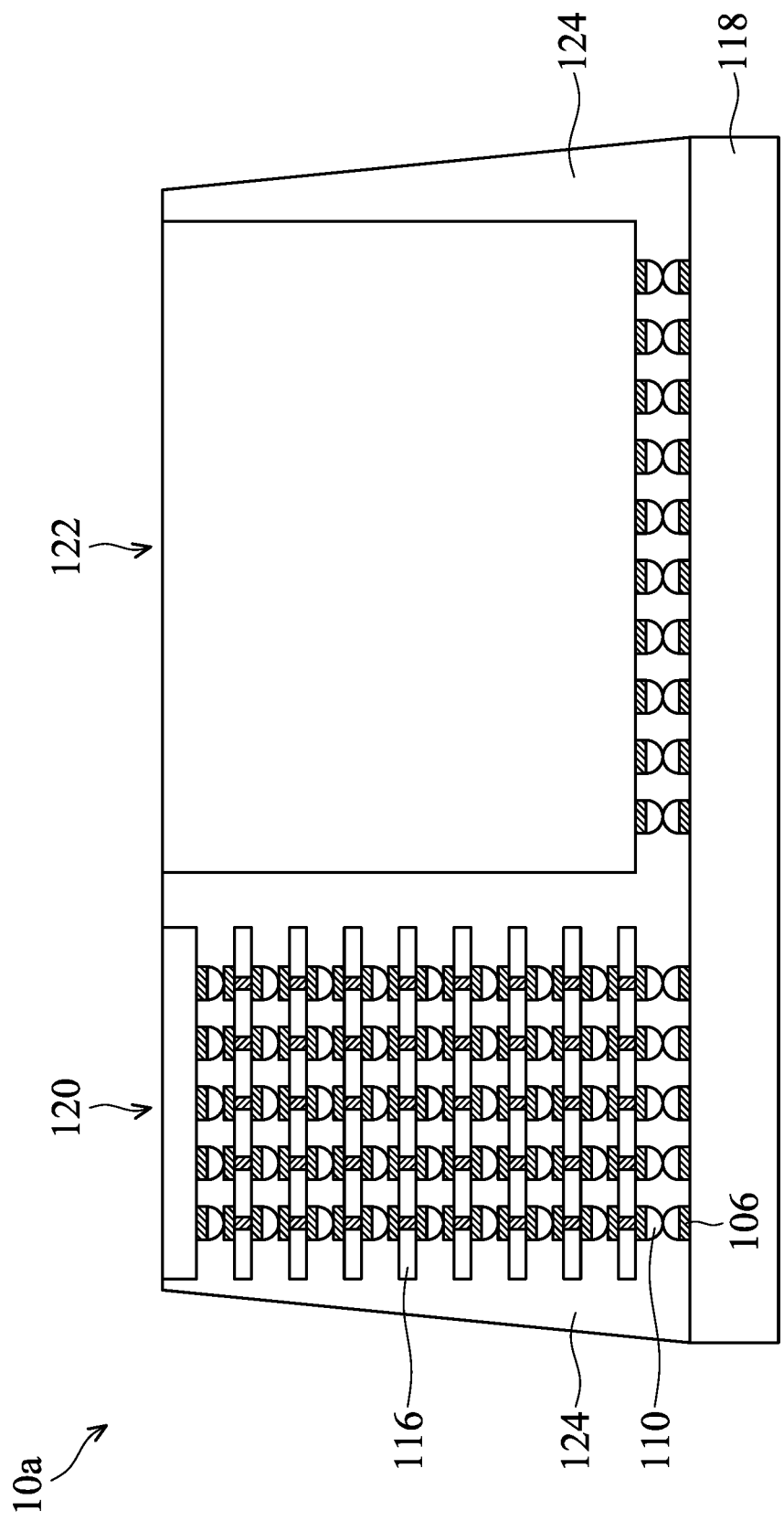

Afterwards, a first encapsulating layer 124 is filled between adjacent chips 116 in the chip stack 120 and surround the chip stack 120 and the semiconductor die 122 as shown in FIG. 1D in accordance with some embodiments. In some embodiments, the first encapsulating layer 124 includes an underfill material, such as epoxy resin, a polymer material, or a filler material. The first encapsulating layer 124 may provide mechanical support and electrical isolation to the conductive pillars 106 and the solder element 110, and protection to the active circuitry from the environment. The first encapsulating layer 124 may be formed by a capillary flow process. In some embodiments, the first encapsulating layer 124 has an upwardly tapered trapezoid shapes in a cross-sectional view.

Next, the first encapsulating layer 124 is cured in accordance with some embodiments (not shown). The first encapsulating layer 124 may be cured by a thermal curing process, an infrared (IR) energy curing process, a UV curing process, or a combination thereof. The curing process may be performed at a temperature that is in a range from about 100° C. to about 200° C. for about 10 minutes to about 24 hours.

Figure 1E:
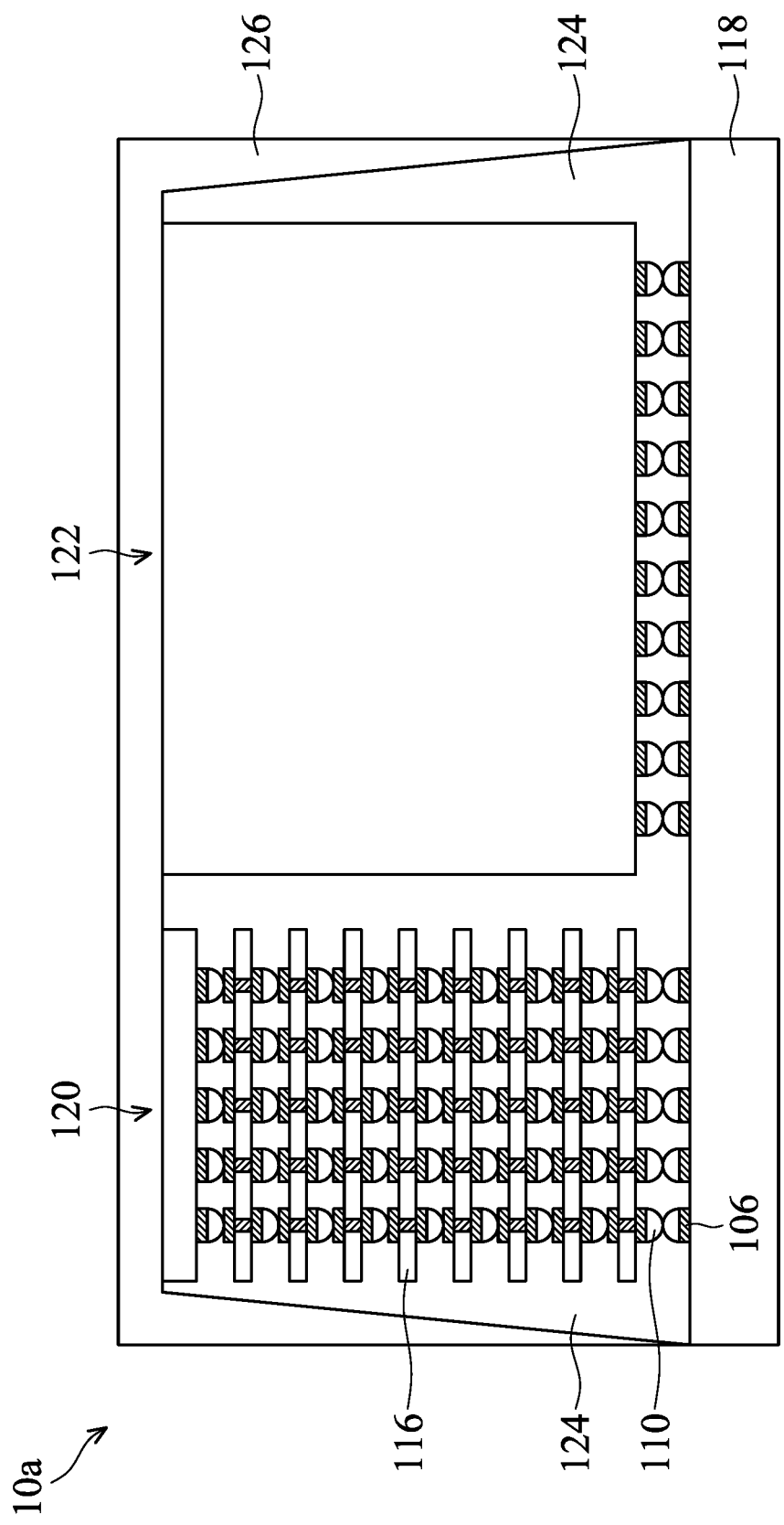

Afterwards, a second encapsulating layer 126 is formed covering the chip stack 120 and the semiconductor die 122 as shown in FIG. 1E in accordance with some embodiments. In some embodiments, the second encapsulating layer 126 surrounds the first encapsulating layer 124. In some embodiments, the second encapsulating layer 126 is a molding compound layer, including an epoxy-based resin with fillers dispersed therein. The fillers may include insulating fibers, insulating particles, other suitable elements, or a combination thereof. In some embodiments, the second encapsulating layer 126 is deposited using a molding process.

In some embodiments, before the second encapsulating layer 126 is formed, the chip stack 120 and the semiconductor die 122 are heated and treated by plasma. After the second encapsulating layer 126 is formed, the second encapsulating layer 126 is cured. The processes for heating and plasma treating before forming the second encapsulating layer 126 and curing the second encapsulating layer 126 may be the same as, or similar to, those used before and after forming first encapsulating layer 124. For the purpose of brevity, the descriptions of these processes are not repeated herein.

Figure 1F:
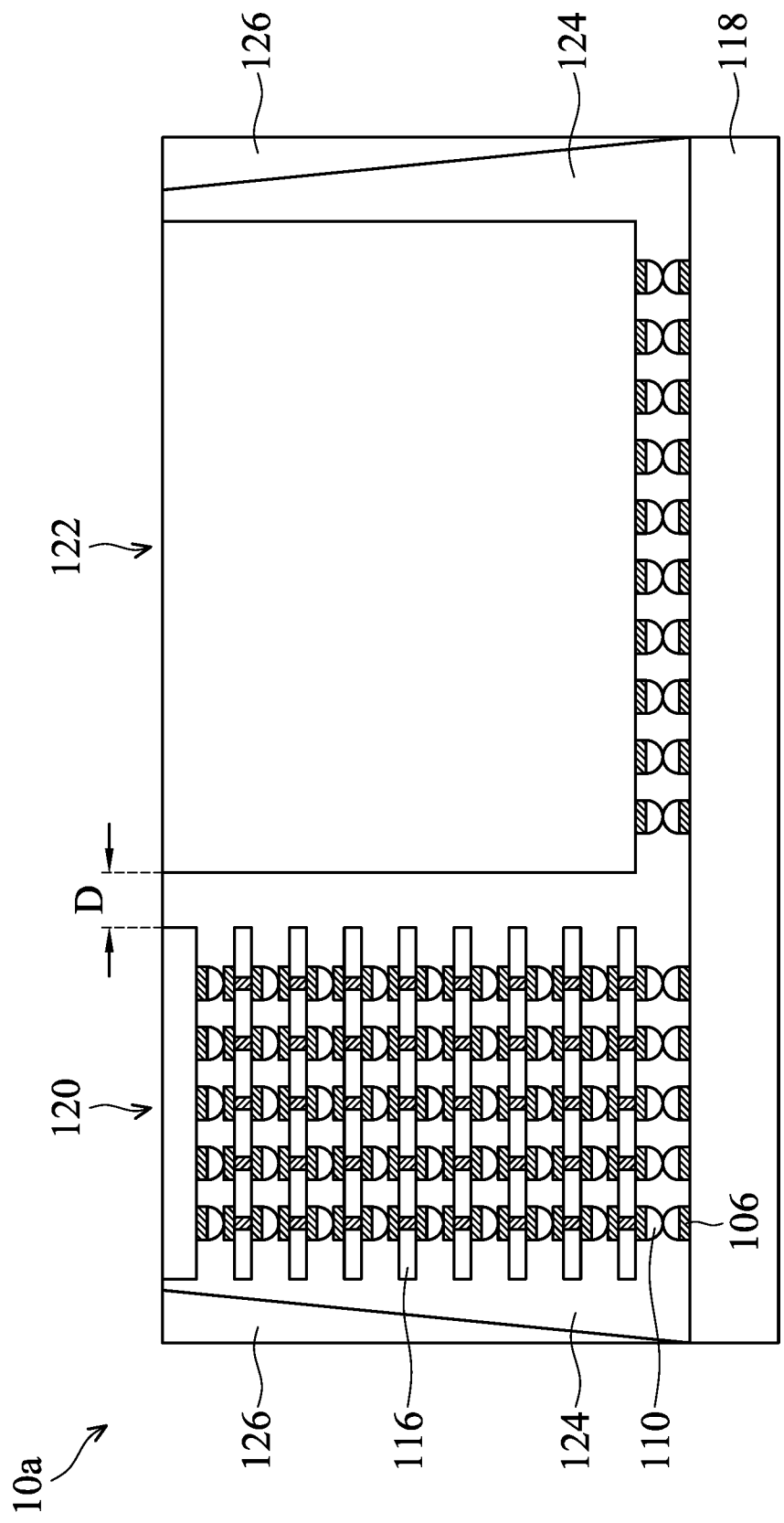

Next, a planarization process is performed on the second encapsulating layer 126 as shown in FIG. 1F in accordance with some embodiments. After the planarization process, the top surface of the chip stack 120 and the top surface of the semiconductor die 122 are exposed. Therefore, it may provide better contact to the heating dissipating structure subsequently formed thereon. The planarization process may include a grinding process, a chemical mechanical polishing (CMP) process, a dry polishing process, an etching process, one or more other applicable processes, or a combination thereof.

In some embodiments, the distance D between the chip stack 120 and the semiconductor die 122 is in a range from about 70 µm to about 180 µm. If the distance D is too great, the package size may be enlarged. If the distance D is too less, the isolation between the chip stack 120 and the semiconductor die 122 may be not sufficient for encapsulating, which may cause void contained in the encapsulation layer after curing.

Moreover, as shown in FIG. 1F, since the chips 116 is stacked directly over the interposer 118, the second encapsulating layer 126 is not formed between the chip stack 120 and the semiconductor die 122. This may help to reduce the distance D between the chip stack 120 and the semiconductor die 122, and further help to reduce the package size.

In addition, as shown in FIG. 1F, the space between the chips 116 in the chip stack 120 and the space between the chip stack 120 and the semiconductor die 122 are both filled with the same material, which is the first encapsulating layer 124. Therefore, the wafer warpage issue may be improved.

Figure 1G:
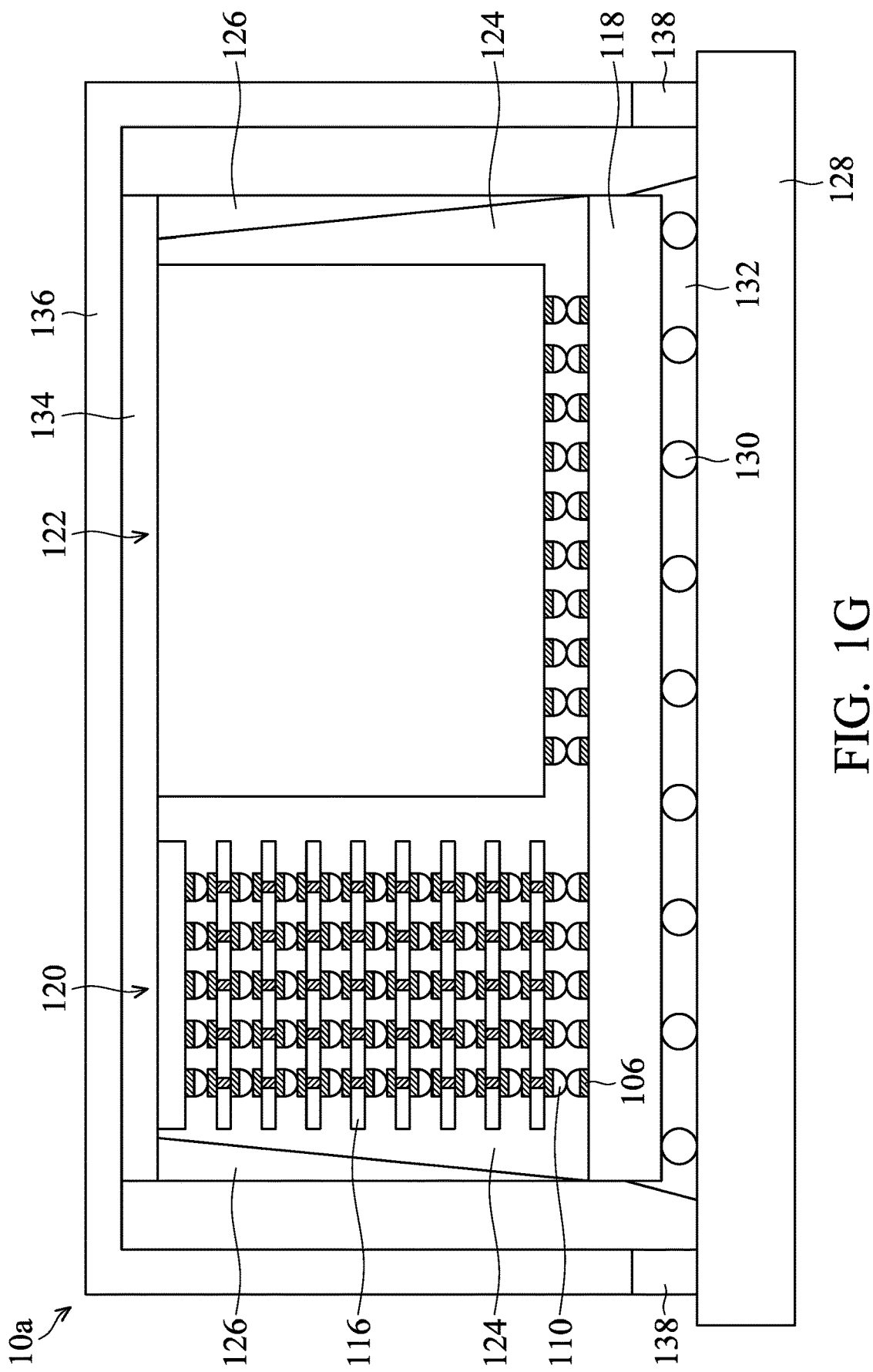

Next, a substrate 128 is provided as shown in FIG. 1G in accordance with some embodiments. The substrate 128 may be referred to as a package component, such as a package substrate, a printed circuit board (PCB), or the like. The substrate 128 may be a package substrate including an insulating layer and one or more patterned conductive layers serving as conductive traces and disposed at various levels of the insulating layer. A combination of the insulating layer with the patterned conductive layers may form a redistribution layer (RDL) structure (which is also referred to as a fan-out structure) in the substrate 128.

The insulating layer of the substrate 128 may be formed of organic materials (such as polymer base materials), non-organic materials (such as silicon nitride, silicon oxide), or high-k dielectric material, or the like. Those patterned conductive layers in the substrate 128 may be made of metal. For the purpose of simplicity and clarity, only a flat substrate is shown. Discrete passive devices (not shown) such as resistors, capacitors, transformers, and the like, may also be bonded to the substrate 128.

Next, the substrate 128 is disposed under the interposer 118 with bumps 130 between them as shown in FIG. 1G in accordance with some embodiments. In some embodiments, the bumps 130 are controlled collapse chip connection (C4) bumps. The bumps 130 may provide electrical connection between the interposer 118 and the substrate 128. The bumps 130 may be made of a solder material, such as Sn, Ag, Au, or another suitable conductive material. The bumps 130 may be formed by evaporation, electroplating, solder transfer, other suitable process, or a combination thereof.

Next, a third encapsulating layer 132 may be formed between the interposer 118 and the substrate 128 and surrounds the bumps 130 as shown in FIG. 1G in accordance with some embodiments. The third encapsulating layer 132 includes an underfill material, such as epoxy resin, a polymer material, or a filler material. The processes for forming the third encapsulating layer 132 may be the same as, or similar to, those used to form the first encapsulating layer 124. For the purpose of brevity, the descriptions of these processes are not repeated herein. In some embodiments as shown in FIG. 1G, the third encapsulating layer 132 has an upwardly tapered trapezoid shapes in a cross-sectional view. In some embodiments, the first encapsulating layer 124 and the third encapsulating layer 132 are made of different materials. Therefore, the wafer warpage issue may be well controlled. In addition, the choice of encapsulating layer 124 may consider the warpage compatibility with the second encapsulating layer 126 for good reliability performance. The choice of encapsulating layer 132 may also consider the warpage compatibility with the substrate 128 for good reliability performance.

Next, a thermal interface material (TIM) structure 134 is formed covering the chip stack 120 and the semiconductor die 122 as shown in FIG. 1G in accordance with some embodiments. In some embodiments, the TIM structure 134 covers the top surface of the first encapsulating layer 124 and the second encapsulating layer 126. The TIM structure 134 may be a thermally conductive and electrically insulating material, such as an epoxy mixed with a metal like silver, gold, or a combination thereof. In some embodiments, the top surface of the chip stack 120 and top surface the semiconductor die 122 are in direct contact with the TIM structure 134. Therefore, the heat generated in the semiconductor package structure 10a may be well conducted to the subsequently formed heat-dissipating structure.

Next, a heat-dissipating structure 136 is formed over the substrate 128 and bonding over the TIM structure 134 as shown in FIG. 1G in accordance with some embodiments. In some embodiments, the heat-dissipating structure 136 is a heat spreader lid. The heat-dissipating structure 136 may have a high thermal conductivity. The heat-dissipating structure 136 may be made of metals and/or metal alloys such as aluminum (Al), copper (Cu), nickel (Ni), cobalt (Co), combinations thereof, and the like. The heat-dissipating structure 136 may also be formed of a composite material, for example silicon carbide, aluminum nitride, graphite, the like, or a combination thereof. The TIM structure 134 and the heat-dissipating structure 136 may dissipate heat from the semiconductor package structure 10*a* to the external environment. The heat-dissipating structure 136 may provide protection to the semiconductor package structure 10*a*.

In some embodiments, the sidewall of the heat-dissipating structure 136 is spaced apart from the second encapsulating layer 126 as shown in FIG. 1G in accordance with some embodiments. The coefficient of thermal expansion (CTE) of the heat-dissipating structure 136, the first encapsulating layer 124, and the second encapsulating layer 126 may be different or the same for improving the wafer warpage, further enhancing the reliability performance.

The heat-dissipating structure 136 is formed over the substrate 128 with an adhesive layer 138 between the heat-dissipating structure 136 and the substrate 128 as shown in FIG. 1G in accordance with some embodiments. The adhesive layer 138 may have a better adhering ability, allowing the heat-dissipating structure 136 attached to the substrate 128. The adhesive layer 138 may be made of epoxy, silicon resin, the like, or a combination thereof.

By stacking chips 116 directly on the interposer 118, many process steps may be skipped, therefore the production time and cost may be reduced. Moreover, the package size may be further reduced, and the tool utilities may be better.

Figure 2A:
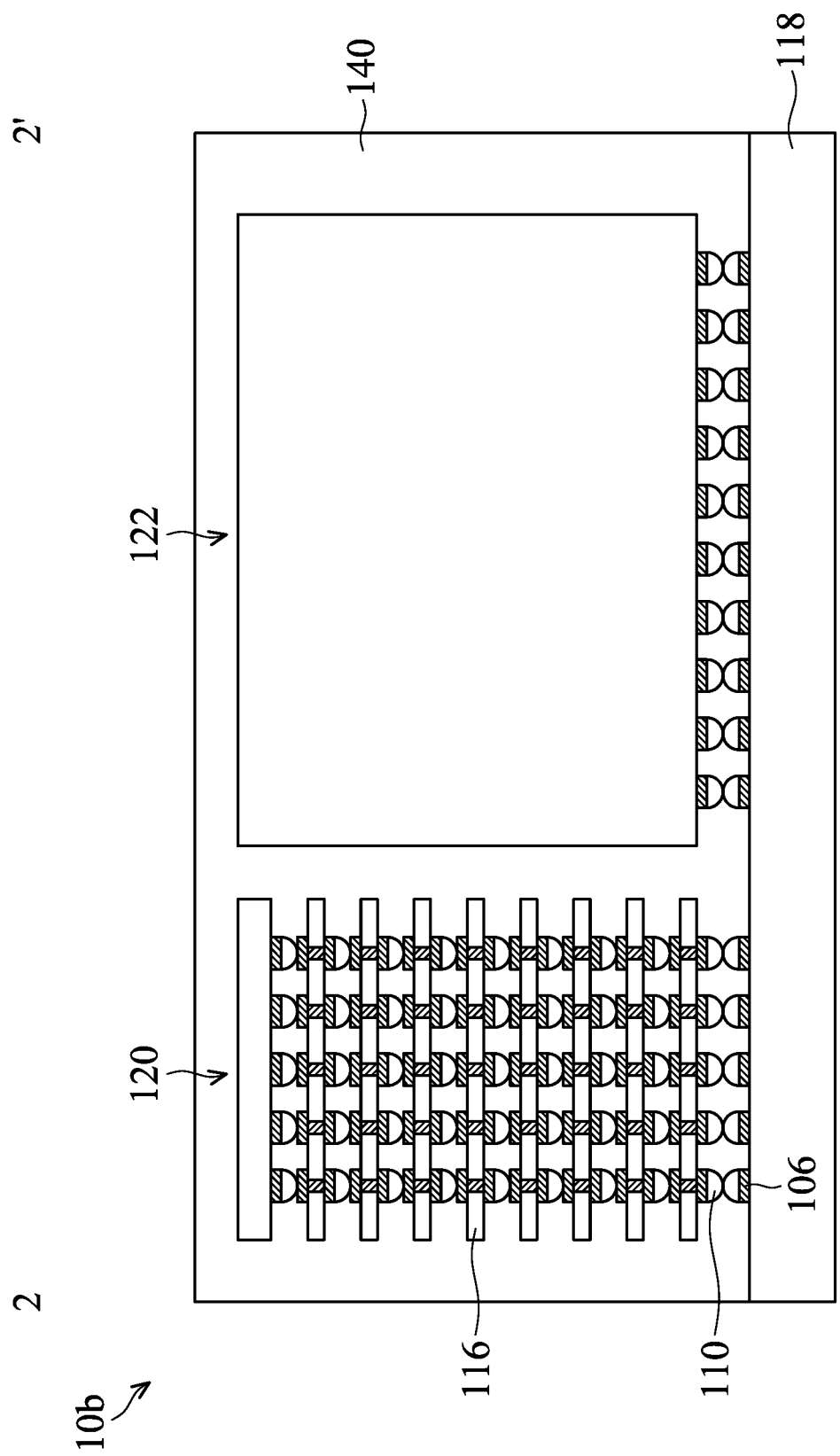
FIGS. 2A-2B are cross-sectional representations of various stages of forming a modified semiconductor package structure, in accordance with some embodiments of the disclosure.
Figure 2B:
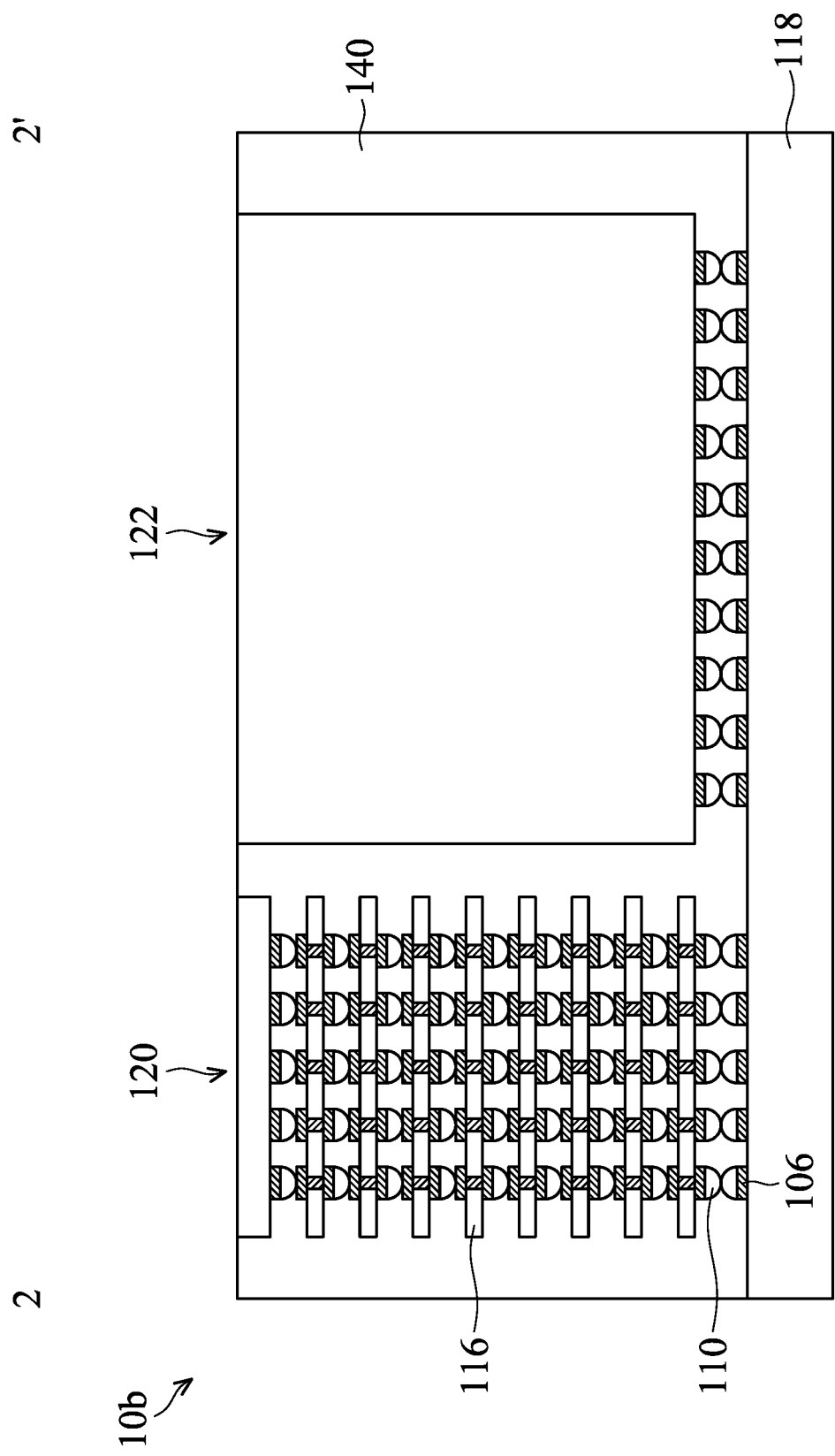

Many variations and/or modifications may be made to the embodiments of the disclosure. FIGS. 2A-2B are cross-sectional representations of various stages of forming a modified semiconductor package structure 10*b*, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 2A and 2B in accordance with some embodiments, a fourth encapsulating layer 140 is filled between the adjacent chips 116 in the chip stack 120 and between the chip stack 120 and the semiconductor die 122.

Figure 3:
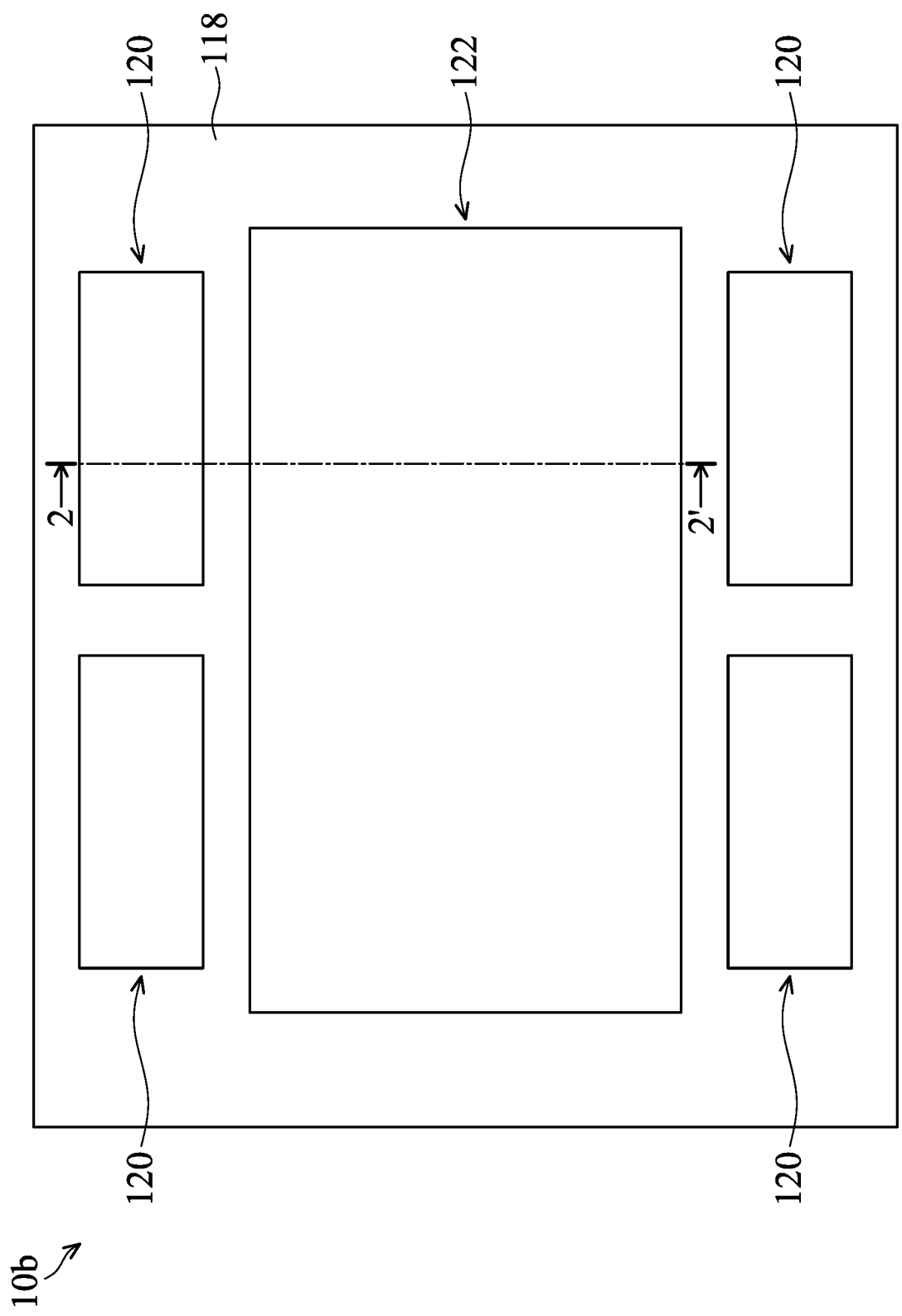
FIG. 3 is a top view of a modified semiconductor package structure, in accordance with some embodiments of the disclosure.

FIG. 3 is a top view of a semiconductor package structure 10*b*, and FIGS. 2A-2B show cross-sectional representations taken along line 2-2' in FIGS. 2A-2B in accordance with some embodiments.

After placing the chip stack 120 and the semiconductor die 122 over the interposer 118, the fourth encapsulating layer 140 is filled between the adjacent chips 116 in the chip stack 120 and between the chip stack 120 and the semiconductor die 122 as shown in FIG. 2A in accordance with some embodiments. In some embodiments, the fourth encapsulating layer 140 is a molded underfill (MUF) layer. The fourth encapsulating layer 140 may be a molding compound, epoxy, resin, PBO, polyimide, or another moldable insulating material. In some embodiments, the fourth encapsulating layer 140 has high adhesion. Therefore, it may be easy for the fourth encapsulating layer 140 to fill in the space between the adjacent chips 116 in the chip stack 120 and between the chip stack 120 and the semiconductor die 122. Furthermore, the fourth encapsulating layer 140 has low coefficient of thermal expansion (CTE) and low modulus in accordance with some embodiments. Therefore, the wafer warpage issue may be improved. In addition, since only a single layer of the fourth encapsulating layer 140 being formed between the adjacent chips 116 in the chip stack 120 and between the chip stack 120 and the semiconductor die 122, the material flexibility may be better.

Next, a planarization process is performed on the fourth encapsulating layer 140 as shown in FIG. 2B in accordance with some embodiments. After the planarization process, the top surface of the chip stack 120 and the top surface of the semiconductor die 122 are exposed. Therefore, it may provide better contact to the TIM structure and the heating dissipating structure subsequently formed thereon. In some embodiments, the TIM structure subsequently formed thereon may cover the top surface of the fourth encapsulating layer 140 (not shown).

Multiple chip stacks 120 are formed beside the semiconductor die 122 as shown in FIG. 3 in accordance with some embodiments. For the purpose of simplicity and clarity, only the chip stacks 120, the semiconductor 122, and the interposer 118 are shown. In some embodiments, the chip stacks 120 are disposed besides each other over the conductive pillars 106 over the interposer 118 (not shown). Since the fourth encapsulating layer 140 may have low coefficient of thermal expansion (CTE) and low modulus, the fourth encapsulating layer 140 may be allowed to fill the space between adjacent chip stacks 120. The wafer warpage issue may be improved and the production cost and time may be reduced.

It should be noted that, the number and the arrangement of the chip stacks 120 and the semiconductor die 122 in FIG. 3 is merely an example, and the present disclosure is not limited thereto. The chip stacks 120 and the semiconductor die 122 may be any number, and the arrangement may be different, depending on the demand of design.

By stacking chips 116 directly on the interposer 118, many process steps may be skipped, therefore the production time and cost may be reduced. Moreover, the package size may be further reduced, and the tool utilities may be better. By filling a single fourth encapsulating layer 140 in the space between the adjacent chips 116 in the chip stack 120 and between the chip stack 120 and the semiconductor die 122, the material flexibility may be better and the wafer warpage issue may be improved. The fourth encapsulating layer 140 may also fill in the space between adjacent chip stacks 120, and the production cost and time may be further reduced.

Figure 4:
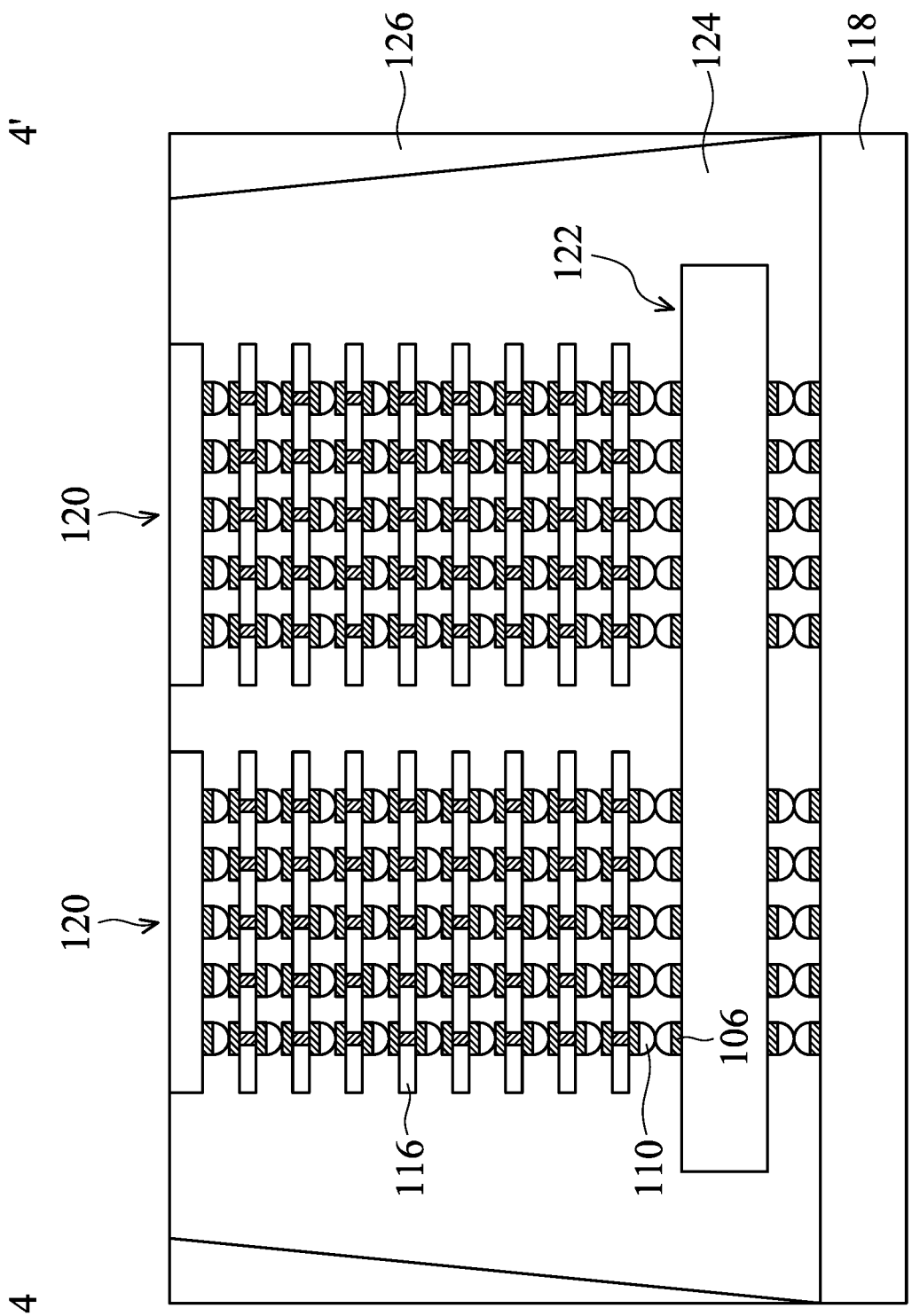
FIG. 4 is a cross-sectional representation of a modified semiconductor package structure, in accordance with some embodiments of the disclosure.

Many variations and/or modifications may be made to the embodiments of the disclosure. FIG. 4 is a cross-sectional representation of a modified semiconductor package structure 10*c*, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4 in accordance with some embodiments, the chip stack 120 is disposed over the semiconductor die 122.

Figure 5:
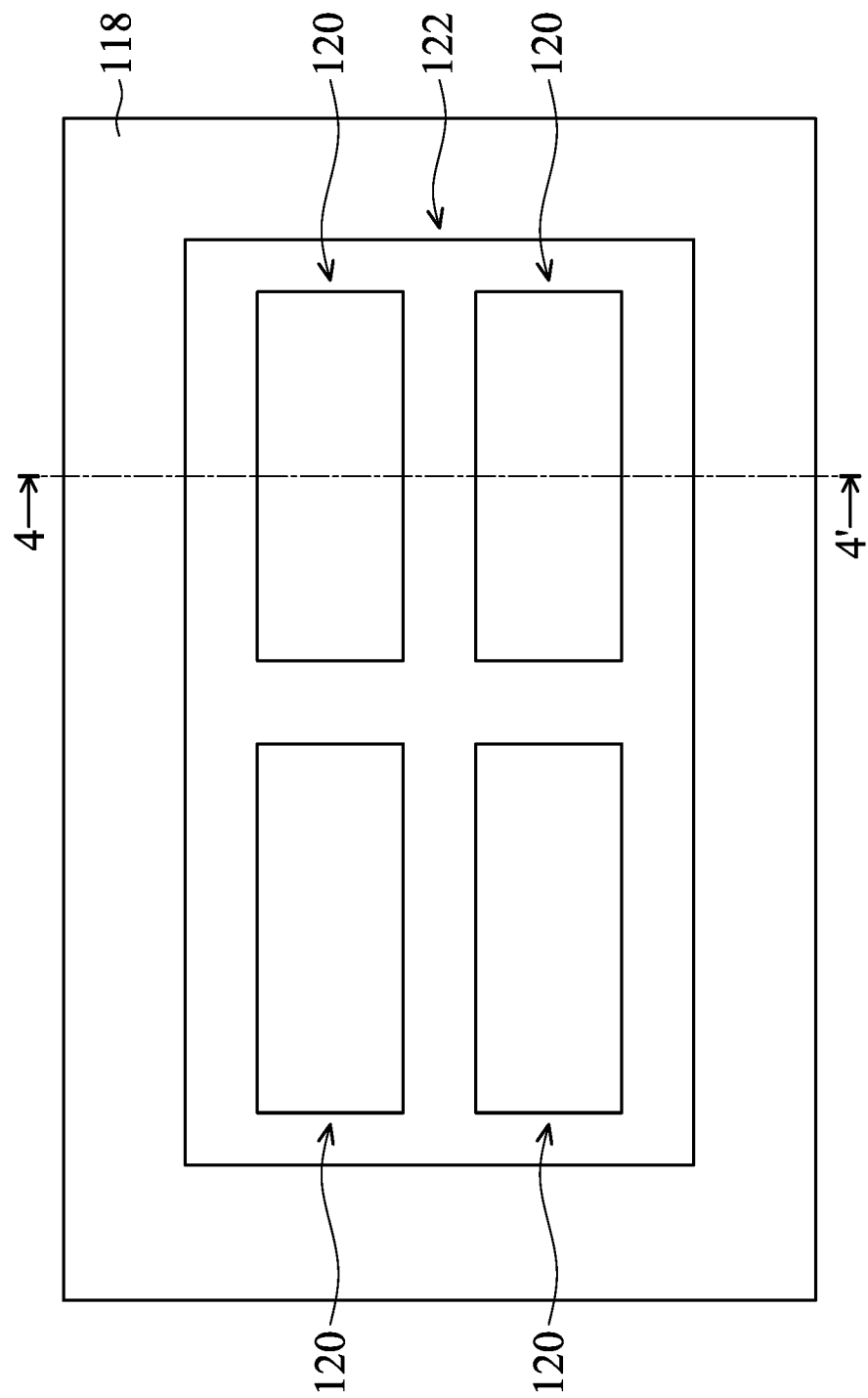
FIG. 5 is a top view of a modified semiconductor package structure, in accordance with some embodiments of the disclosure.

FIG. 5 is a top view of a semiconductor package structure 10*c*, and FIG. 4 shows a cross-sectional representation taken along line 4-4' in FIG. 5 in accordance with some embodiments.

The conductive pillars 106 are formed over opposite sides of the semiconductor die 122 as shown in FIG. 4 in accordance with some embodiments. After forming conductive pillars 106 over the interposer 118, the semiconductor die 122 is placed over the interposer 118 by aligning the conductive pillars 106 over the interposer 118 and the semiconductor die 122. Afterwards, the chips 116 are stacked directly over the semiconductor die 122 and the chip stack 120 is formed over the semiconductor die 122 over the interposer 118.

Next, a first encapsulating layer 124 is formed between the chips 116 of the chip stack 120 and surrounding the chip stack 120 and the semiconductor die 122, and the second encapsulating layer 126 is formed covering the chip stack 120 and the semiconductor die 122. Afterwards, a planarization process is performed on the second encapsulating layer 126 as shown in FIG. 4 in accordance with some embodiments. After the planarization process, the top surface of the chip stack 120 is exposed. Moreover, the top surface of the chip stack 120 is level with the top surface of the first encapsulating layer 124.

Multiple chip stacks 120 are formed over the semiconductor die 122 as shown in FIG. 5 in accordance with some embodiments. For the purpose of simplicity and clarity, only the chip stacks 120, the semiconductor 122, and the interposer 118 are shown in FIG. 5. The projection of the chip stack 120 is within range of the projection of the semiconductor die 122 in the top view as shown in FIG. 5 in accordance with some embodiments. Therefore, the chip area of the semiconductor package structure 10c may be further saved by disposing the chip stack 120 over the semiconductor die 122 over the interposer 118.

It should be noted that, the number and the arrangement of the chip stacks 120 and the semiconductor die 122 in FIG. 5 is merely an example, and the present disclosure is not limited thereto. The chip stacks 120 and the semiconductor die 122 may be any number, and the arrangement may be different, depending on the demand of design.

By stacking chips 116 directly on the interposer 118, many process steps may be skipped, therefore the production time and cost may be reduced. Moreover, the package size may be further reduced, and the tool utilities may be better. By disposing the chip stacks 120 over the semiconductor die 122 over the interposer 118, the chip area may be further saved.

As described previously, stacking chips 116 to form a chip stack 120 over the interposer 118 directly may simplify the process and reduce production time and cost. The distance between the chip stack 120 and the semiconductor die 122 and the chip area may be therefore further reduced. The structure flexibility of die placement, die size, and die gap may be also improved. In some embodiments, the top surface of the chip stack 120 and the semiconductor die 122 are in direct contact with the TIM structure 134, and therefore the heat generated in the semiconductor package structure 10a may be well conducted. With the chip stack 120 and the semiconductor die 122 disposed over the interposer 118 in a single tool, the tool utilities may be better. In the embodiments as shown in FIGS. 2A, 2B and 3, the material flexibility may be better and the wafer warpage issue may be improved with the fourth encapsulating layer 140 filled in the space between adjacent chip stacks 120. In the embodiments as shown in FIGS. 4 and 5, the chip area may be further reduced by disposing chip stacks 120 over the semiconductor die 122 over the interposer 118.

Embodiments of a semiconductor package structure and a method for forming the same are provided. The method for forming the semiconductor package structure may include directly stacking chips to form a chip stack over an interposer. Some processes may be skipped and the production time and cost may be reduced. Furthermore, the structure flexibility may be improved by filling an encapsulating layer into the space between the chip stack and the semiconductor die. The tool utilities may be better since the chip stack and the semiconductor die are disposed on the interposer in a single tool.

In some embodiments, a method for forming a semiconductor package structure is provided. The method for forming a semiconductor package structure includes stacking chips to form a chip stack over an interposer. The method for forming a semiconductor package structure also includes disposing a semiconductor die over the interposer. The method for forming a semiconductor package structure also includes filling a first encapsulating layer between the chips and surrounding the chip stack and the semiconductor die. The method for forming a semiconductor package structure also includes forming a second encapsulating layer covering the chip stack and the semiconductor die. The first encapsulating layer fills the gap between the chip stack and the semiconductor die.

In some embodiments, a method for forming a semiconductor package structure is provided. The method for forming a semiconductor package structure includes forming conductive pillars over an interposer. The method for forming a semiconductor package structure also includes stacking chips to form a first chip stack over an interposer. The method for forming a semiconductor package structure also includes placing a semiconductor die over the conductive pillars over the interposer. The method for forming a semiconductor package structure also includes filling an encapsulating layer between adjacent chips in the first chip stack and between the first chip stack and the semiconductor die. The method for forming a semiconductor package structure also includes planarizing the encapsulating layer to expose the top surface of the first chip stack and the top surface of the semiconductor die.

In some embodiments, a semiconductor package structure is provided. The semiconductor package structure includes a chip stack with chips stacked over an interposer. The semiconductor package structure also includes a semiconductor die disposed over an interposer. The semiconductor package structure also includes a first encapsulating layer which is located between the chips and which fills the space between the chip stack and the semiconductor die. The semiconductor package structure also includes a second encapsulating layer surrounding the first encapsulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor package structure, comprising:
   stacking chips to form a chip stack over an interposer;
   disposing a semiconductor die over the interposer;
   filling a first encapsulating layer between the chips and surrounding the chip stack and the semiconductor die, wherein a portion of the first encapsulating layer is sandwiched between the neighboring chips; and
   forming a second encapsulating layer covering the chip stack and the semiconductor die, wherein the first encapsulating layer fills a gap between the chip stack and the semiconductor die, wherein the first encapsulating layer between the chip stack and the semiconductor die is in direct contact with the interposer.

2. The method for forming the semiconductor package structure as claimed in claim 1, further comprising:
disposing a substrate under the interposer with a bump between the interposer and the substrate; and
filling a third encapsulating layer between the interposer and the substrate,
wherein the third encapsulating layer surrounds the bump.

3. The method for forming the semiconductor package structure as claimed in claim 1, further comprising:
planarizing the second encapsulating layer to expose a top surface of the chip stack and a top surface of the semiconductor die.

4. The method for forming the semiconductor package structure as claimed in claim 2, further comprising:
forming a thermal interface material (TIM) structure over the chip stack and the semiconductor die; and
bonding a heat-dissipating structure over the substrate over the TIM structure.

5. The method for forming the semiconductor package structure as claimed in claim 1, wherein a projection of the chip stack is within range of a projection of the semiconductor die in a top view.

6. The method for forming the semiconductor package structure as claimed in claim 1, wherein a top surface of the first encapsulating layer is substantially coplanar with a top surface of the second encapsulating layer.

7. The method for forming the semiconductor package structure as claimed in claim 4, wherein a top surface of the first encapsulating layer is substantially coplanar with a bottom surface of the TIM structure.

8. A method for forming a semiconductor package structure, comprising:
forming a chip stack and a semiconductor die over an interposer;
filling a first encapsulating layer between chips of the chip stack and a space between the chip stack and the semiconductor die; and
forming a second encapsulating layer surrounding the first encapsulating layer,
wherein the second encapsulating layer and the semiconductor die are separated by the first encapsulating layer, wherein a top surface of the first encapsulating layer is substantially coplanar with a top surface of the second encapsulating layer, wherein a width of the top surface of the first encapsulating layer between the chip stack and the semiconductor die is substantially equal to a distance between the chip stack and the semiconductor die.

9. The method for forming the semiconductor package structure as claimed in claim 8, wherein the second encapsulating layer fills up the space between the chip stack and the semiconductor die.

10. The method for forming the semiconductor package structure as claimed in claim 8, wherein the second encapsulating layer covers the sidewall and the top surface of the first encapsulating layer.

11. The method for forming the semiconductor package structure as claimed in claim 8, further comprising:
planarizing the second encapsulating layer so that a top surface of the chip stack is level with a top surface of the first encapsulating layer.

12. The method for forming the semiconductor package structure as claimed in claim 11, wherein after planarizing the second encapsulating layer, the top surface of the chip stack is level with a top surface of the semiconductor die.

13. The method for forming the semiconductor package structure as claimed in claim 8, further comprising:
stacking the chip stack over the semiconductor die over an interposer.

14. The method for forming the semiconductor package structure as claimed in claim 8, further comprising:
forming a thermal interface material structure covering the chip stack and the semiconductor die;
bonding a heat-dissipating structure over the thermal interface material structure,
wherein the heat-dissipating structure is separated from the second encapsulating layer.

15. A method for forming a semiconductor package structure, comprising:
stacking chips to form a chip stack over an interposer;
disposing a semiconductor die over the interposer;
filling a first encapsulating layer between the chips in the chip stack and between the chip stack and the semiconductor die, wherein a top surface of the first encapsulating layer is substantially coplanar with a top surface of the semiconductor die;
forming a second encapsulating layer covering the chip stack and the semiconductor die; and
planarizing the second encapsulating layer to expose a top surface of the chip stack and the top surface of the semiconductor die,
wherein the first encapsulating layer is in direct contact with a top surface of the interposer.

16. The method for forming the semiconductor package structure as claimed in claim 15, wherein a projection of the chip stack and a projection of the semiconductor die are separated from each other in a top view.

17. The method for forming the semiconductor package structure as claimed in claim 15, further comprising:
forming a thermal interface material structure covering the chip stack, the semiconductor die, the first encapsulating layer, and the second encapsulating layer.

18. The method for forming the semiconductor package structure as claimed in claim 17, wherein the thermal interface material is in direct contact with the second encapsulating layer.

19. The method for forming the semiconductor package structure as claimed in claim 17, further comprising:
bonding a heat-dissipating structure over the thermal interface material structure,
wherein a sidewall of the heat-dissipating structure is separated from a sidewall of the second encapsulating layer.

20. The method for forming the semiconductor package structure as claimed in claim 15, wherein a top surface of the first encapsulating layer is continuous between the chip stack and the semiconductor die.

* * * * *